United States Patent

Ohtani et al.

[11] Patent Number: 6,051,101
[45] Date of Patent: Apr. 18, 2000

[54] SUBSTRATE PROCESSING APPARATUS, SUBSTRATE TRANSPORT APPARATUS AND SUBSTRATE TRANSFER APPARATUS

[75] Inventors: Masami Ohtani; Yasuo Imanishi; Masao Tsuji; Takanori Kawamoto; Masaki Iwami; Joichi Nishimura; Akihiko Morita, all of Kyoto, Japan

[73] Assignee: Dainippon Screen Mfg. Co., Ltd., Japan

[21] Appl. No.: 09/039,824

[22] Filed: Mar. 16, 1998

[30] Foreign Application Priority Data

Mar. 21, 1997 [JP] Japan ............................... P-09-068201

[51] Int. Cl.[7] ....................................................... B65H 1/00
[52] U.S. Cl. ............................................. 156/345; 414/222
[58] Field of Search .................................... 414/222–225; 156/345; 134/137; 118/320

[56] References Cited

U.S. PATENT DOCUMENTS 5,571,325   11/1996   Ueyama et al. ...................... 118/320
5,826,129   10/1998   Hasebe et al. ........................ 396/611

FOREIGN PATENT DOCUMENTS 8-46010   2/1996   Japan.

*Primary Examiner*—Richard Bueker
*Assistant Examiner*—Alva C Powell
*Attorney, Agent, or Firm*—Ostrolenk, Faber, Gerb & Soffen, LLP

[57] ABSTRACT

A unit arrangement part comprises a chemical cabinet on its lowermost part, while coating units for forming a resist film on a substrate and developing units for developing the substrate after exposure are arranged on four corners of an apparatus above the chemical cabinet. Further, multistage thermal processing units for thermal-processing the substrate are arranged on front and rear portions of the apparatus above these wet processing units. A cleaning unit for supplying a cleaning liquid such as pure water and cleaning the substrate is arranged on a front side of the apparatus between the coating units as a substrate processing unit. Thus provided is a substrate processing apparatus having excellent workability in maintenance with a high degree of freedom in arrangement of processing units.

24 Claims, 15 Drawing Sheets

SUBSTRATE PROCESSING APPARATUS, SUBSTRATE TRANSPORT APPARATUS AND SUBSTRATE TRANSFER APPARATUS

BACKGROUND OF THE INVENTION

1. Field of the Invention

The present invention relates to a substrate processing apparatus for performing a series of processings including heating, cooling and a processing with a processing liquid on a thin-plate type substrate (hereinafter simply referred to as "substrate") such as a semiconductor substrate or a liquid crystal glass substrate, and a substrate transport apparatus and a substrate transfer apparatus employed therein.

2. Description of the Background Art

In general, a substrate processing apparatus of the aforementioned type performs a series of substrate processings by circularly transporting a substrate between a heating unit for heating the substrate, a cooling unit for cooling the same and a chemical processing unit for processing the substrate with a chemical liquid by a substrate transport robot.

In a conventional substrate processing apparatus, for example, a plurality of sets of multistage units formed by stacking various types of single-substrate processing units in multiple stages are arranged around a substrate transport robot, which is provided at the center of the apparatus to be vertically movable and swingable. The multistage units, which are formed by stacking the same types of processing units in multiple stages, are separated into a multistage thermal processing unit formed by stacking only a plurality of thermal processing units for heating and cooling a substrate in multiple stages and a chemical wet processing multistage unit formed by stacking only a plurality of chemical wet processing units in multiple stages.

However, the aforementioned substrate processing apparatus obtained by stacking the same types of processing units in multiple stages is inferior in maintenance particularly in upper-stage processing units in relation to the chemical wet processing multistage unit, due to handling of the chemical liquid.

Further, a plurality of sets of multistage units are basically separately arranged around the substrate transport robot provided at the center of the aforementioned substrate processing apparatus, and hence the degree of freedom generally tends to reduce in arrangement of the processing units, to result in disadvantageousness in attainment of functional design responsive to set conditions and effective transportation/processings responsive to the object.

In addition, the aforementioned substrate processing apparatus vertically drives the substrate transport robot with a ball screw. Thus, the substrate transport robot must be extracted upward in maintenance of the processing units, to result in inferior workability in maintenance.

Further, the aforementioned substrate processing apparatus must sufficiently ensure the stroke of an arm of the substrate transport robot, so that the substrate transport robot can access all processing units forming the plurality of multistage units arranged around the same. Thus, the arm of the transport robot or the like increases in size, and the overall substrate processing apparatus also increases in size for ensuring a swing space therefor.

SUMMARY OF THE INVENTION

The present invention is directed to an apparatus for processing a substrate.

The apparatus for processing a substrate comprises a) substrate transport means which is vertically movable and rotatable about a vertical axis, b) a plurality of wet processing units which are arranged around the substrate transport means for processing the substrate with prescribed processing liquids, and c) at least one thermal processing unit which is arranged above at least one of the plurality of wet processing units for applying a thermal process to the substrate.

All wet processing units are arranged on a lower side so that the apparatus is excellent in maintenance. Further, the wet processing units are not vertically arranged but can be arranged on arbitrary positions around the substrate transport means, whereby the degree of freedom in arrangement of the processing units can be improved to attain functional design responsive to set conditions or the like and effective transportation/processings responsive to the object.

According to another aspect of the present invention, an apparatus for processing a substrate comprises a) substrate transport means which is vertically telescopic and rotatable about a vertical axis, and b) a plurality of processing unit groups which are arranged around the substrate transport means and comprising a multistage unit group formed by stacking a plurality of processing units in multiple stages.

The substrate transport means may not be removed but sufficiently contracted to be reduced in height in maintenance of the processing units, whereby the apparatus is improved in maintenance.

According to still another aspect of the present invention, an apparatus for processing a substrate comprises a) a plurality of corner units which are arranged on four corner positions of a unit arrangement part having a substantially rectangular bottom surface region for performing processings with prescribed processing liquids respectively, b) substrate transport means which is arranged at a central portion of the unit arrangement part and rotatable about a vertical axis, and c) an off-corner unit which is arranged between the plurality of corner units for performing a prescribed processing on the substrate.

Arrangement is enabled with excellent space efficiency while sufficiently ensuring foot spaces for the corner units, whereby the substrate processing apparatus can be miniaturized.

The present invention is also directed to an apparatus for transporting a substrate between a plurality of processing units.

The apparatus for transporting a substrate between a plurality of processing units comprises a) a rotation mechanism rotatable about a vertical axis, and b) an arm which is rotated by the rotation mechanism about the vertical axis and comprises b-1) a hand for holding the substrate, and b-2) horizontal moving means for horizontally moving the hand, comprising a combination of a plurality of telescopic mechanisms.

The sizes of the arms, i.e., the swing spaces can be reduced while sufficiently ensuring the strokes of the arms to be capable of accessing all processing units arranged around the substrate transport apparatus, whereby the substrate transport apparatus itself can be miniaturized.

Accordingly, an object of the present invention is to provide a substrate processing apparatus having excellent workability in maintenance and a high degree of freedom in arrangement of processing units.

Another object of the present invention is to provide a substrate transport apparatus rendering a substrate processing apparatus miniature with excellence in maintenance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A concrete embodiment of the present invention is now described in detail with reference to the drawings.

Figure 1A:
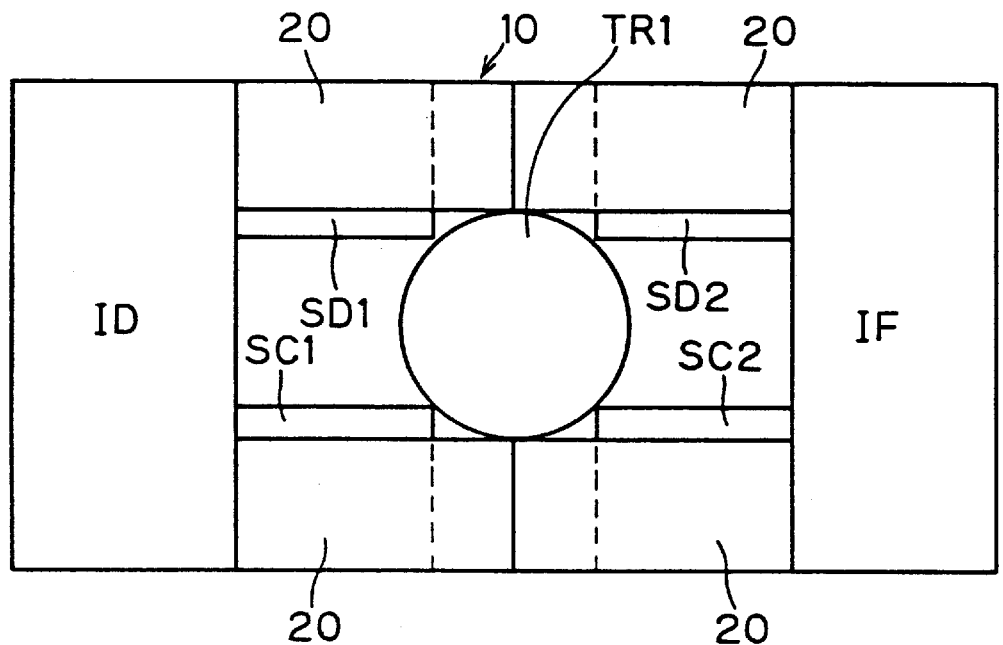
FIGS. 1A and 1B are a plan view and a front elevational view illustrating a substrate processing apparatus according to an embodiment of the present invention respectively.
Figure 1B:
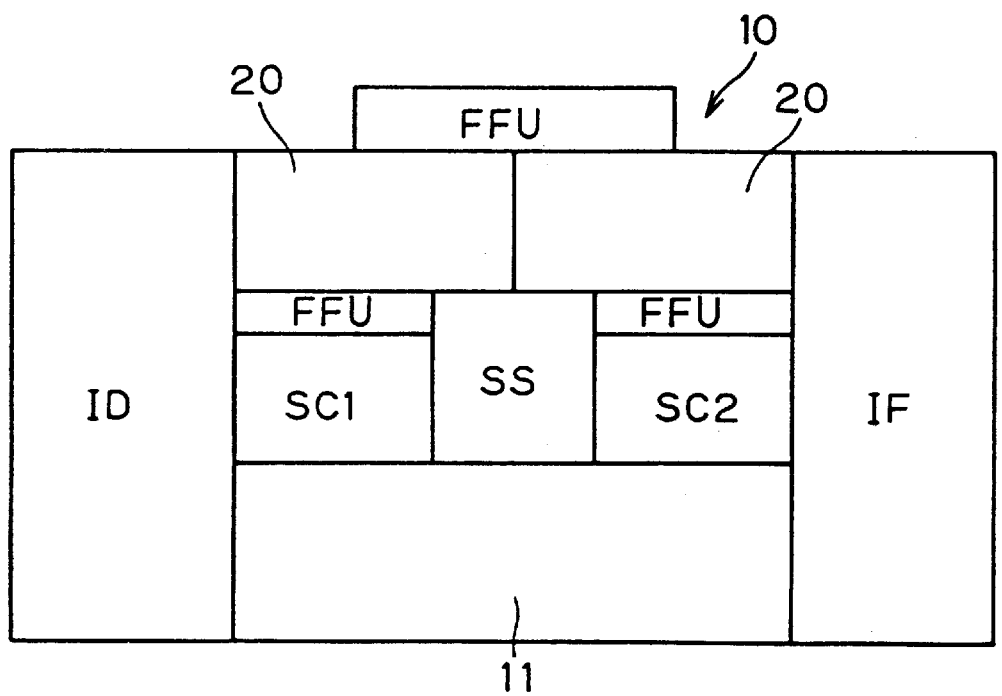

FIGS. 1A and 1B are adapted to illustrate a substrate processing apparatus according to the embodiment. FIG. 1A is a plan view of the apparatus, and FIG. 1B is a front elevational view thereof. As shown in FIGS. 1A and 1B, the substrate processing apparatus according to this embodiment is formed by an indexer ID for introducing and discharging a substrate, a unit arrangement part 10 provided with a plurality of processing units for processing the substrate and substrate transport means for transporting the substrate to each processing unit, and an interface IF connected with an exposure device.

The unit arrangement part 10 comprises a chemical cabinet 11 receiving tanks storing chemical liquids, pipes and the like therein on its lowermost portion, while coating units SC1 and SC2 for forming a resist film on the substrate and developing units SD1 and SD2 for developing the substrate after exposure are arranged on four corners above the chemical cabinet 11 as wet processing units for processing the substrate with processing liquids. Further, multistage thermal processing units 20 for heating or cooling the substrate are arranged above the wet processing units SC1, SC2, SD1 and SD2 on front and rear portions of the apparatus. A cleaning unit SS for supplying a cleaning liquid such as deionized water to the substrate and cleaning the same is arranged on a front side of the apparatus between the coating units SC1 and SC2 as a substrate processing unit.

A transport robot TR1 is arranged at the central portion of the apparatus held between the coating units SC1 and SC2 and the developing units SD1 and SD2 as substrate transport means for accessing all processing units provided around the same and transferring/receiving the substrate to/from these units. This transport robot TR1 is vertically movable and rotatable about a central vertical axis.

A filter fan unit FFU for forming a downflow of clean air is provided on the uppermost portion of the unit arrangement part 10. Other filter fan units FFU for forming downflows of clean air on the wet processing unit sides are also provided immediately under the multistage thermal processing units 20.

Figure 2:
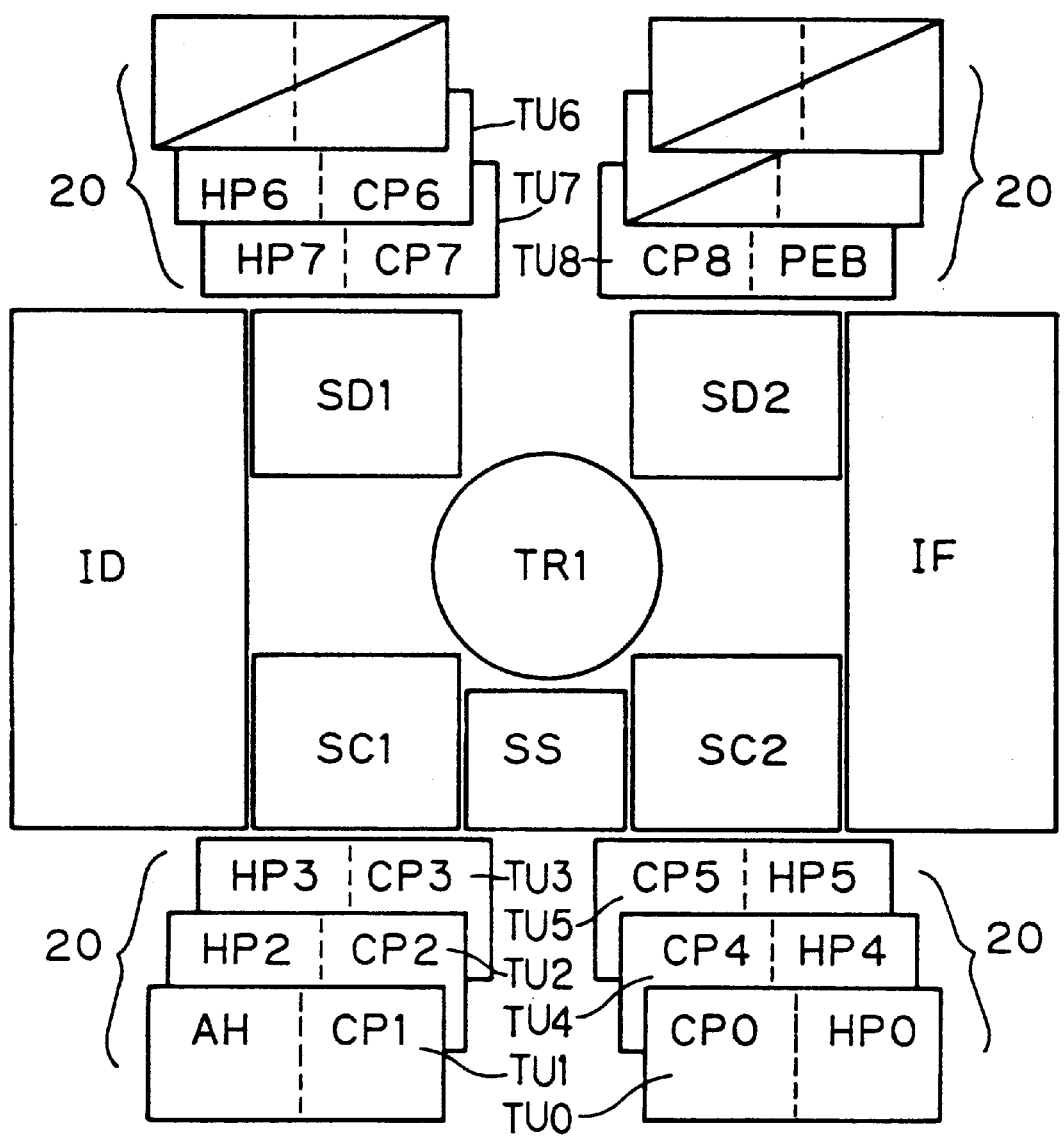
FIG. 2 is adapted to illustrate the arrangement of processing units forming the apparatus shown in FIGS. 1A and 1B.

FIG. 2 illustrates the arrangement structure of the processing units shown in FIGS. 1A and 1B. Three stages of thermal processing units TU1, TU2 and TU3 are arranged above the coating unit SC1 as the multistage thermal processing unit 20. The upper thermal processing unit TU1 comprises an adhesion reinforcing part AH and a cool plate part CP1 in its interior, the intermediate thermal processing unit TU2 comprises a hot plate part HP2 and a cool plate part CP2 in its interior, and the lower thermal processing unit TU3 comprises a hot plate part HP3 and a cool plate part CP3 in its interior.

Three stages of thermal processing units TU0, TU4 and TU5 are arranged above the coating unit SC2 as the multistage thermal processing unit 20. The upper thermal processing unit TU0 comprises a hot plate part HP0 and a cool plate part CP0 in its interior, the intermediate thermal processing unit TU4 comprises a hot plate part HP4 and a cool plate part CP4 in its interior, and the lower thermal processing unit TU5 comprises a hot plate part HP5 and a cool plate part CP5 in its interior.

Two stages of thermal processing units TU6 and TU7 are arranged above the developing unit SD1 as the multistage thermal processing unit 20. The intermediate thermal processing unit TU6 comprises a hot plate part HP6 and a cool plate part CP6 in its interior, and the lower thermal processing unit TU7 comprises a hot plate part HP7 and a cool plate part CP7 in its interior. While the upper stage of this multistage thermal processing unit 20 is vacant in this embodiment, an additional thermal processing unit having a hot plate part and a cool plate part can be assembled into this stage in response to the use and the object.

A single-stage thermal processing unit TU8 is arranged above the developing unit SD2 as the multistage thermal processing unit 20. This thermal processing unit TU8 comprises a post-exposure bake plate part PEB and a cool plate part CP8 in its interior. While the upper and intermediate stages of this multistage thermal processing unit 20 are vacant in this embodiment, additional thermal processing units having hot plate parts and cool plate parts can be properly assembled into these stages in response to the use and the object.

Figure 3:
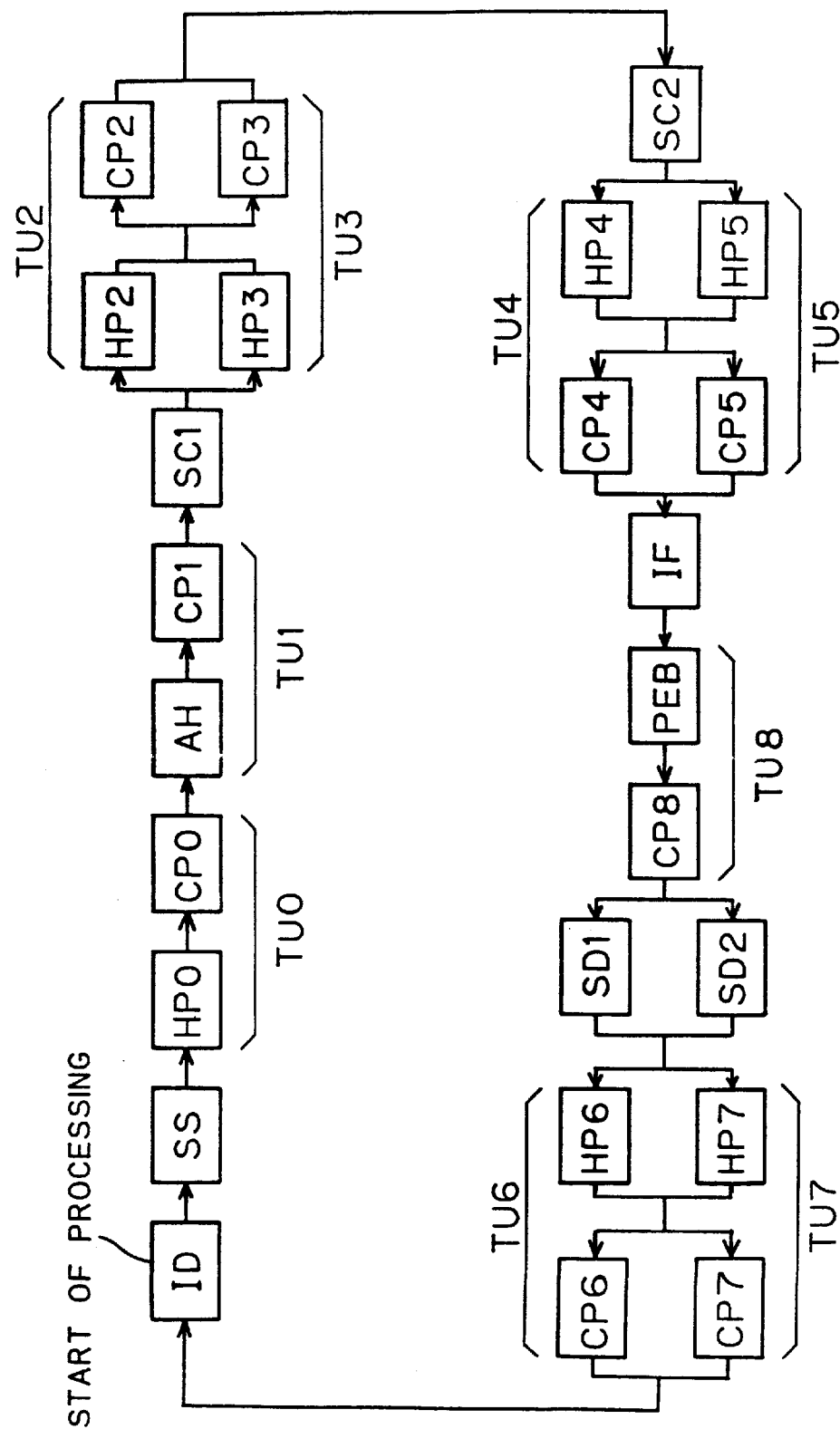
FIG. 3 is adapted to illustrate exemplary substrate processing steps in the apparatus shown in FIGS. 1A, 1B and 2.

FIG. 3 is adapted to illustrate transportation of a specific substrate in the substrate processing apparatus shown in FIGS. 1A, 1B and 2 and the flow of the processings.

First, the transport robot TR1 transports the substrate received from the indexer ID to the cleaning unit SS, and exchanges this substrate with that processed in the cleaning unit SS. The cleaning unit SS supplies deionized water to the surface of the substrate transferred thereto, and cleans the substrate surface.

Then, the transport robot TR1 transports the substrate completely cleaned in the cleaning unit SS to the thermal processing unit TU0. The thermal processing unit TU0 performs thermal processings consisting of heating and cooling (cooling includes a nonthermal state, which is not forcible cooling) on the substrate in the hot plate part HP0 and the cool plate part CP0 respectively.

Then, the transport robot TR1 transports the substrate completely thermal-processed in the thermal processing unit TU0 to the thermal processing unit TU1. The thermal processing unit TU1 heats the substrate under an adhesion reinforcing gas atmosphere in the adhesion reinforcing part AH, and cools the same in the cool plate part CP1.

Then, the transport robot TR1 transports the substrate completely thermal-processed in the thermal processing unit TU1 to the coating unit SC1. The coating unit SC1 supplies a resist liquid to the substrate by spin coating.

Then, the transport robot TR1 transports the substrate supplied with the resist liquid in the coating unit SC1 to either one of the thermal processing units TU2 and TU3. The thermal processing unit TU2 or TU3 performs resist hardening processings consisting of heating and cooling in the hot plate part HP2 or HP3 and the cool plate part CP2 or CP3 respectively. The thermal processing units TU2 and TU3 perform parallel processings since the thermal processing steps in these units require a longer time as compared with the remaining processing units.

Then, the transport robot TR1 transports the substrate completely thermal-processed in the thermal processing unit TU2 or TU3 to the coating unit SC2. The coating unit SC2 forms a protective film on the resist film of the substrate by spin coating.

Then, the transport robot TR1 transports the substrate completely provided with the protective film in the coating unit SC2 to either one of the thermal processing units TU4 and TU5. The thermal processing unit TU4 or TU5 performs protective film hardening processings consisting of heating and cooling in the hot plate part HP4 or HP5 and the cool plate part CP4 or CP5 respectively. Forward processings in the substrate processing apparatus according to this embodiment are completed through the aforementioned steps.

Then, the transport robot TR1 transfers the substrate completely thermal-processed in the thermal processing unit TU4 or TU5 to the interface IF. The interface IF has functions of temporarily holding the unexposed substrate received from the unit arrangement part 10 and feeding the same to the exposure device for attaining time adjustment in relation to the throughput of the exposure device, and temporarily holding the exposed substrate received from the exposure device and thereafter returning the same to the unit arrangement part 10.

Then, the transport robot TR1 transports the exposed substrate returning to the interface IF to the thermal processing unit TU8. The thermal processing unit TU8 performs post-exposure bake processings consisting of heating and cooling on the substrate in the post-exposure bake plate part PEB and the cool plate part CP8 respectively.

Then, the transport robot TR1 transports the substrate subjected to the post-exposure bake processings in the thermal processing unit TU8 to either one of the developing units SD1 and SD2. The developing unit SD1 or SD2 develops the exposed resist film of this substrate.

Then, the transport robot TR1 transports the substrate completely developed in the developing unit SD1 or SD2 to either one of the thermal processing units TU6 and TU7. The thermal processing unit TU6 or TU7 performs post-bake processings consisting of heating and cooling on the substrate in the hot plate part HP6 or HP7 and the cool plate part CP6 or CP7 respectively.

Finally, the transport robot TR1 returns the finished substrate completely thermal-processed in the thermal processing unit TU6 or TU7 to the indexer ID. Reverse processings in the substrate processing apparatus according to this embodiment are completed through the aforementioned steps.

Figure 4:
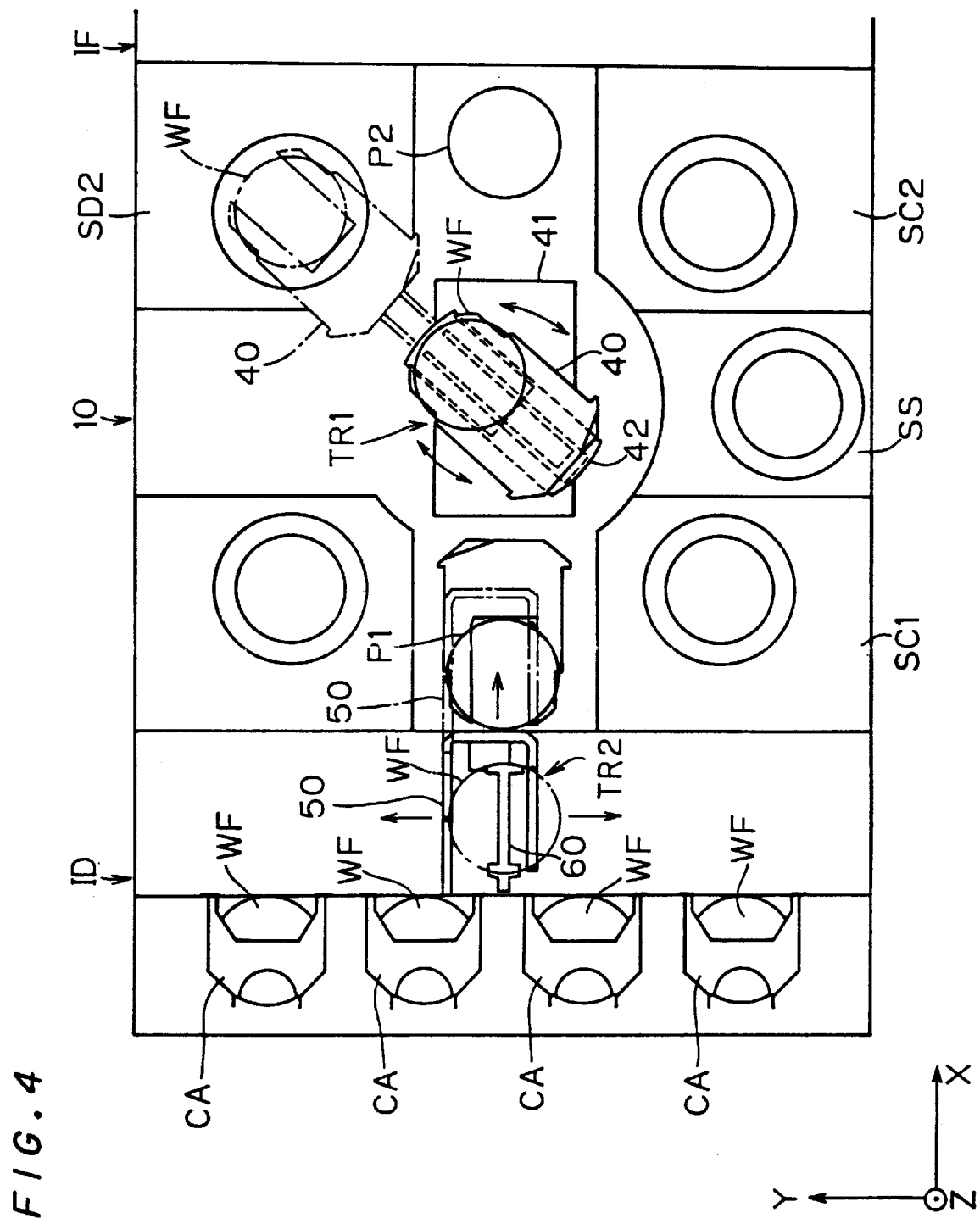
FIG. 4 is adapted to illustrate substrate transfer between a transport robot and an indexer etc.

FIG. 4 illustrates transportation of each substrate WF in the unit arrangement part 10, transportation of the substrate WF in the indexer ID, and transfer of the substrate WF between the unit arrangement part 10 and the indexer ID.

A transfer robot TR2 provided on the indexer ID comprises a first hand 50 for transferring/receiving each substrate WF to/from the transport robot TR1 of the unit arrangement part 10 and a second hand 60 for introducing/extracting each substrate WF into/from each cassette CA.

The transfer robot TR2 receives each substrate WF transported by the transport robot TR1 of the unit arrangement part 10 to a transfer position P1 and stores the same in each cassette CA, extracts each substrate WF from each cassette CA, moves the same to the transfer position P1, and transfers the same to the transport robot TR1.

Namely, the transfer robot TR2 can reciprocate on a passage provided in the indexer ID along a Y direction as a whole. On the position shown in FIG. 4, the first hand 50 moves in a ±Z direction (i.e., the vertical direction) and an X direction (i.e., toward the unit arrangement part 10), for transferring/receiving each substrate WF to/from the transport robot TR1. When the transfer robot TR2 moves in the ±Y direction from the illustrated position to face to the principal surface of any cassette CA, on the other hand, the second hand 60 moves in the ±Z direction and the −X direction for transferring/receiving the substrate WF to/from the cassette CA.

The transport robot TR1 provided at the center of the unit arrangement part 10 transfers the substrate WF received from the transfer robot TR2 on the transfer position P1 to any of the peripheral processing units, e.g., the cleaning unit SS.

The transport robot TR1 comprises a stage 41 which is vertically movable in the ±Z direction and a head 42 which is mounted on the stage 41 to be rotatable about a vertical axis. This head 42 comprises a hand 40 which can access all peripheral processing units while supporting the substrate WF. This hand 40, having a vertical pair of holder members independently expanding/contracting horizontally in an X-Y plane, exchanges the processed substrate WF in any processing unit with an unprocessed substrate WF on either holder member.

Thus, the transport robot TR1 exchanges the processed substrate WF with the unprocessed substrate WF and goes through circular transportation of the substrate WF in a flow similar to that shown in FIG. 3, thereby progressing the processing of the substrate WF in each processing unit (excluding the parallel processing units) in the unit arrangement part 10 by one stage.

As to the indexer ID and the interface IF, the transfer position P1 and another transfer position P2 serve as a kind of processing units, for exchanging the substrate WF thereon. Namely, the transport robot TR1 moves the substrate WF completely processed in the final processing unit (e.g., the thermal processing unit TU4) related to the forward direction to the transfer position P2 and exchanges the same with that received from the interface IF. Further, the transport robot TR1 moves the substrate WF completely processed in the final processing unit (e.g., the thermal processing unit TU6) related to the reverse direction to the transfer position P1 and exchanges the same with that received from the indexer ID.

The transport robot TR1 repeats the aforementioned circular transportation, thereby gradually progressing the processings of the substrate WF in a flow identical to that in FIG. 3.

Figure 5:
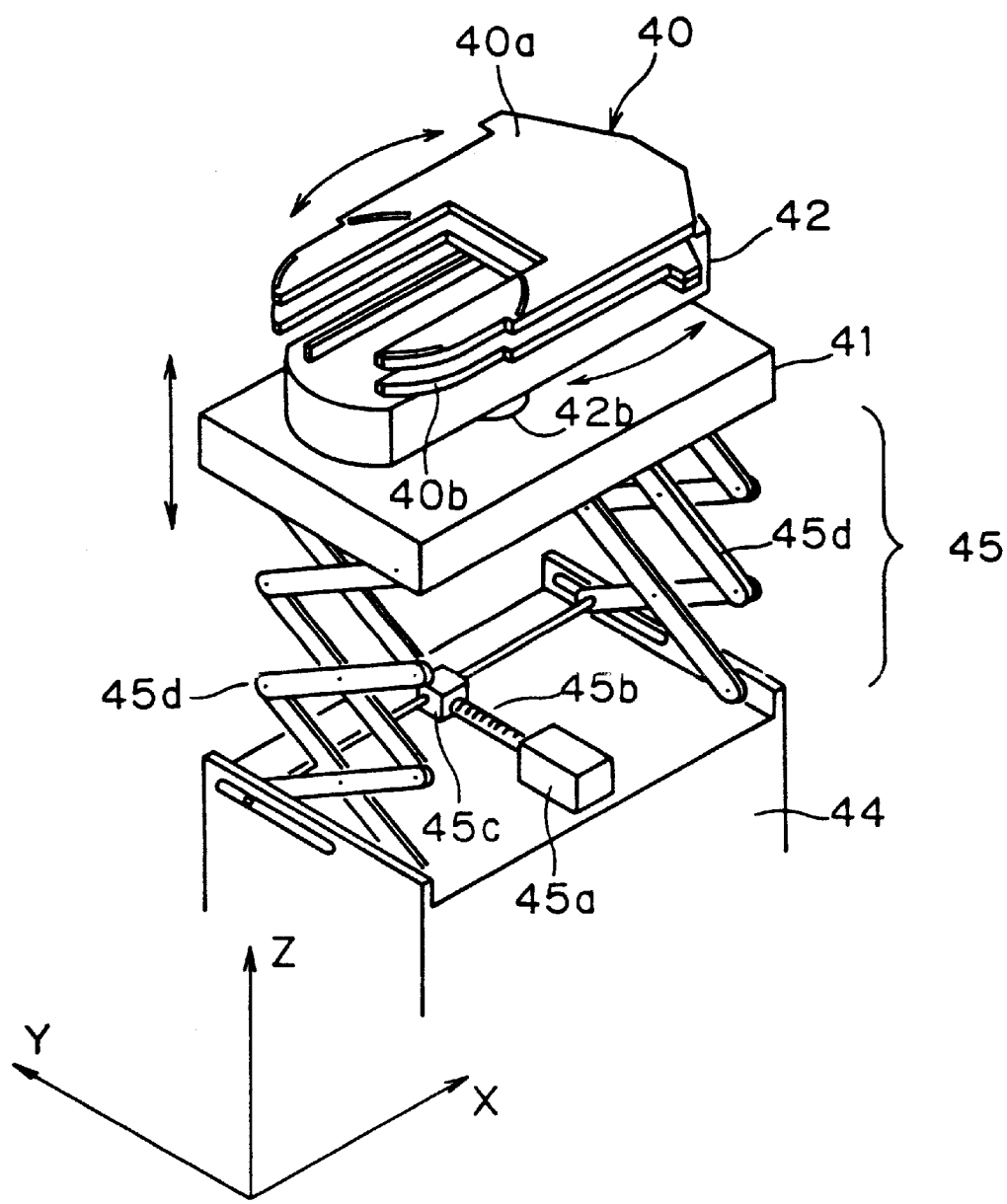
FIG. 5 is a perspective view illustrating the structure of the transport robot.
Figure 6A:
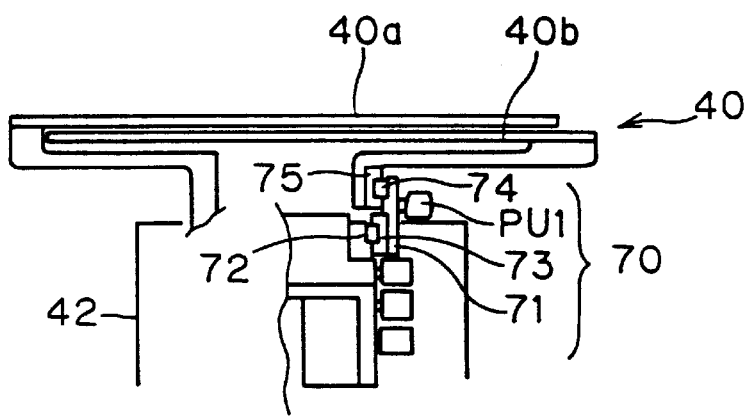
FIGS. 6A and 6B are a rear elevational view and a side elevational view illustrating the upper structure of the transport robot respectively.
Figure 6B:
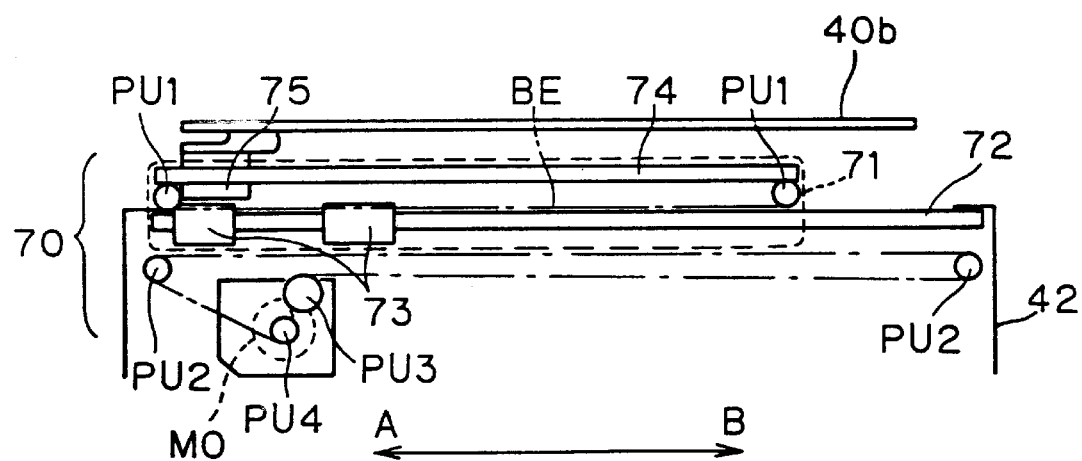
Figure 7:
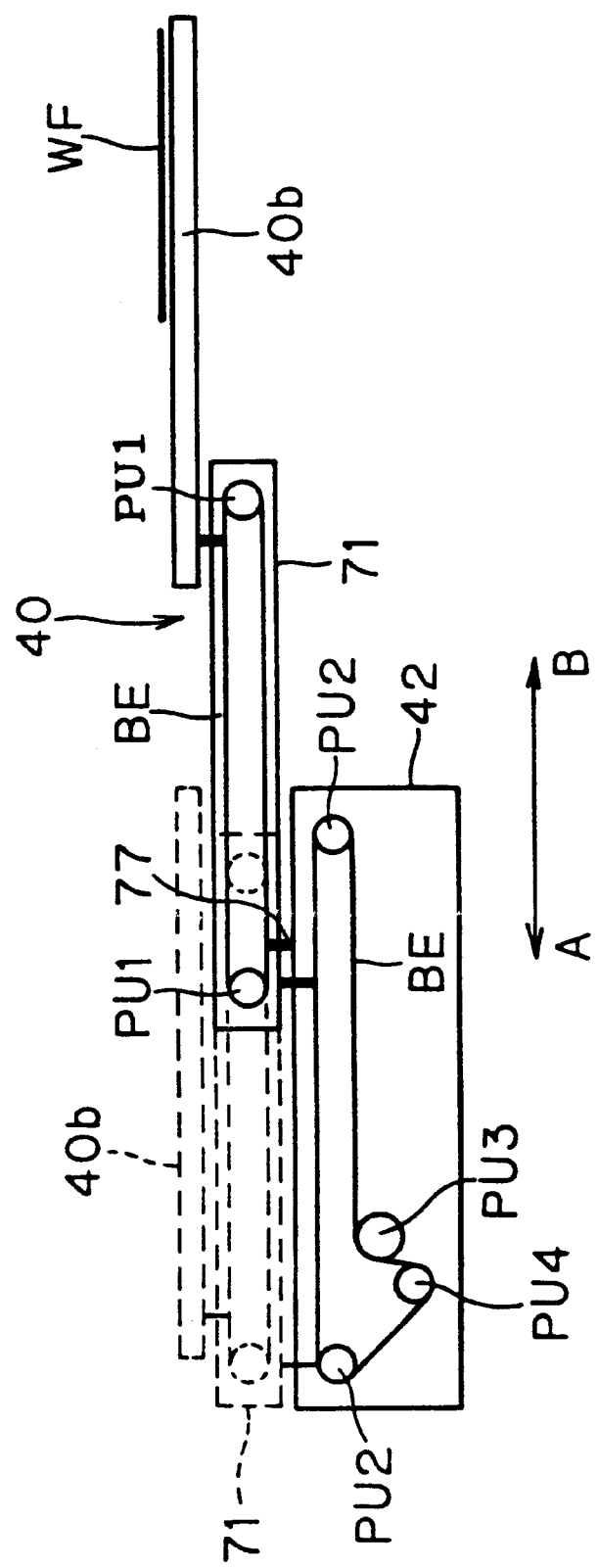
FIG. 7 is adapted to illustrate expansion/contraction of a hand of the transport robot.

FIGS. 5 to 7 are adapted to illustrate the structure and operations of the transport robot TR1. FIG. 5 is a perspective view of the transport robot TR1, FIGS. 6A and 6B illustrate the structures of rear and side surfaces of the transport robot TR1 respectively, and FIG. 7 illustrates the operations of the hand 40 of the transport robot TR1.

As shown in FIG. 5, the stage 41 supporting the head 42 of the transport robot TR1 is vertically movable in the ±Z direction by a Z-axis driving mechanism 45 provided between the same and a base 44. The Z-axis driving mechanism 45 has such a pantograph structure that a screw shaft 45b rotates by normal/reverse rotation of a motor 45a which is fixed onto the base 44 for moving a coupling member 45c fitted with the screw shaft 45b in the ±Y direction. Following the movement of the coupling member 45c, a pair of pantograph links 45d coupled to both sides of this coupling member 45c expand and contract. The stage 41 is coupled to/supported on upper ends of the pair of pantograph links 45d, so that the normal/reverse rotation of the motor 45a is converted to vertical motion of the stage 41 through the expansion/contraction of the pantograph links 45d as a result.

The stage 41 contains a rotation driving mechanism (not shown) for rotating/driving a vertical rotary shaft 42b extending from a central lower portion of the head 42, so that the head 42 swings to be rotatable/movable to an arbitrary position about a Z axis. The hand 40 provided on the head 42 consists of a pair of holder members 40a and 40b, each of which can support the substrate WF. The holder members 40a and 40b can reciprocate in the ±X direction through the mechanism provided in the head 42 in the illustrated state.

As shown in a rear elevational view of FIG. 6A and a side elevational view of FIG. 6B, the holder member 40b can reciprocate in the A-B direction by an expansion/contraction driving mechanism 70 contained in the head 42. The other holder member 40a can also reciprocate in the A-B direction by a mechanism (not shown) similar to the expansion/contraction driving mechanism 70.

The expansion/contraction driving mechanism 70 has a two-stage structure provided with a boom 71 for ensuring a stroke interposed between the head 42 and the holder member 40b. Sliding members 73 guided by a guide 72 provided on the head 42 to reciprocally move in the A-B direction are fixed to the boom 71. Still another sliding member 75 guided by another guide 74 provided on the boom 71 to reciprocally move in the A-B direction is fixed to the holder member 40b. A belt BE is extended along a pair of pulleys PU1 provided on a side surface of the boom 71, and the sliding member 75 is fixed to a part of the belt BE. Another belt BE is extended along a plurality of pulleys PU2, PU3 and PU4 provided in the head 42 too, and the boom 71 is fixed to a part of this belt BE. The pulley PU4 is coupled to a motor MO, and driven by this motor MO to properly rotate.

FIG. 7 illustrates movement of the holder member 40b shown in FIG. 5. When the pulley PU4 is driven by the motor MO contained in the head 42 to unidirectionally rotate, the boom 71 connected to the belt BE advances in the A-B direction, to extend outward beyond the head 42. When the boom 71 extends outward beyond the head 42, the belt BE extended along the pulleys PU1 of the boom 71, which is fixed to the head 42 through a stop member 77, so rotates that the holder member 40b connected to this belt BE advances in the A-B direction and extends outward beyond the boom 71, whereby the holder member 40b moves to a position shown by solid lines most expanding the hand 40 as a result. Dotted lines show a most contracting state of the hand 40.

Figure 8:
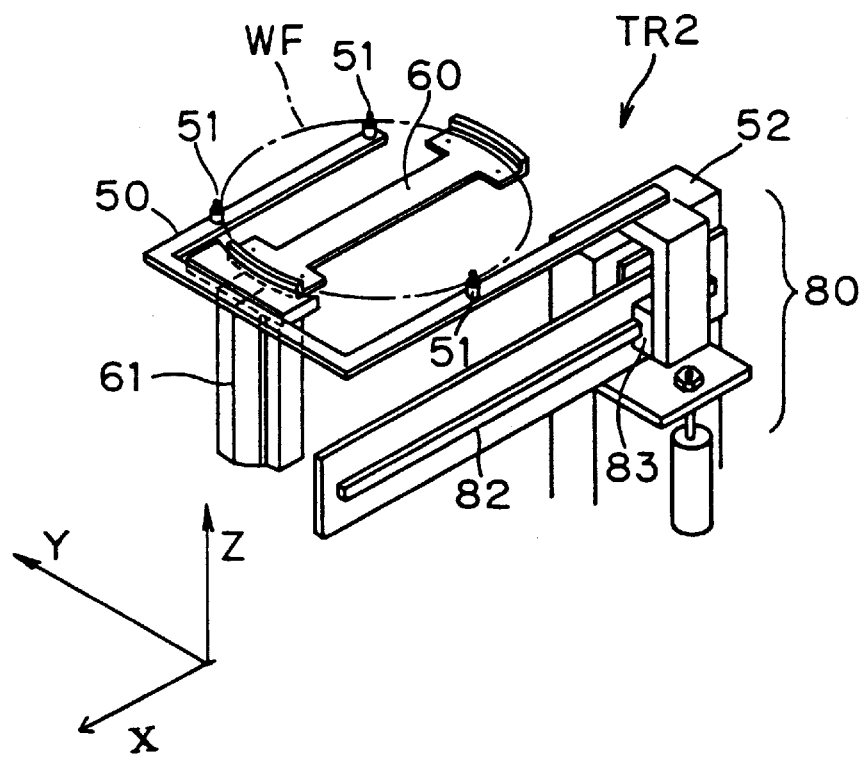
FIG. 8 is a perspective view illustrating the structure of a transfer robot.

FIG. 8 illustrates the transfer robot TR2 provided on the indexer ID in detail. The first hand 50 transfers/receives the substrate WF to/from the second hand 60, and also transfers/receives the substrate WF to/from the transport robot TR1 of the unit arrangement part 10. The second hand 60 transfers/receives the substrate WF to/from each cassette CA, and also transfers/receives the substrate WF to/from the first hand 50.

Figure 9:
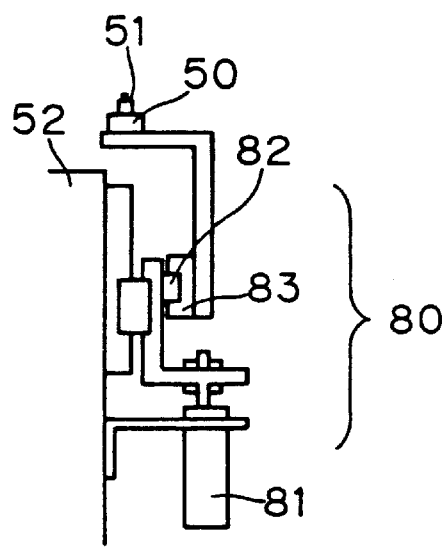
FIG. 9 is adapted to illustrate a principal part of a driving mechanism for the transfer robot shown in FIG. 8.
Figure 10:
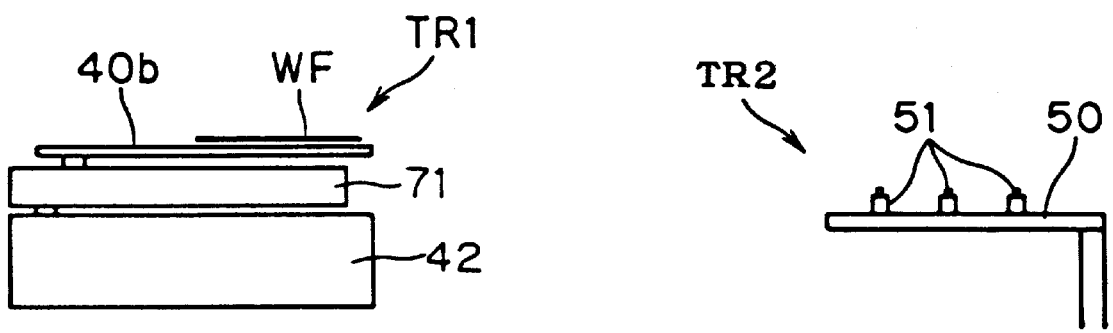
FIG. 10 is adapted to illustrate transfer of a substrate WF from the transport robot to the transfer robot.
Figure 11:
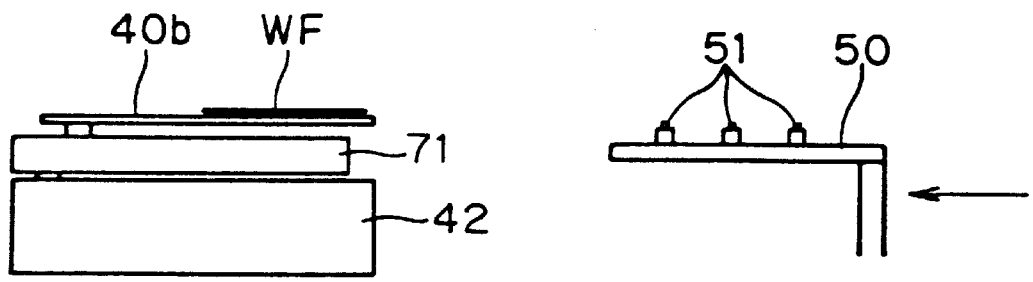
FIG. 11 is adapted to illustrate transfer of the substrate WF from the transport robot to the transfer robot.
Figure 12:
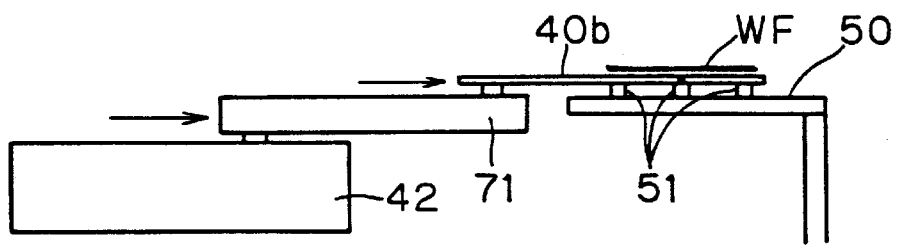
FIG. 12 is adapted to illustrate transfer of the substrate WF from the transport robot to the transfer robot.
Figure 13:
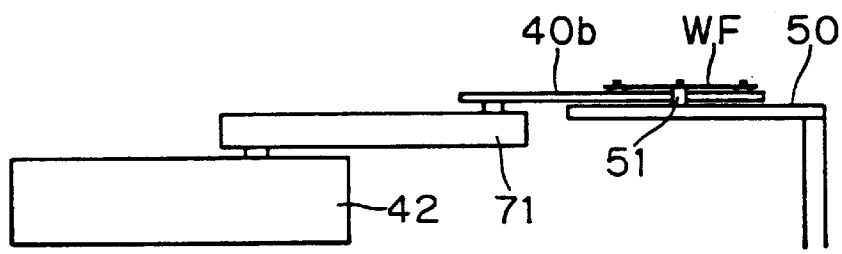
FIG. 13 is adapted to illustrate transfer of the substrate WF from the transport robot to the transfer robot.
Figure 14:
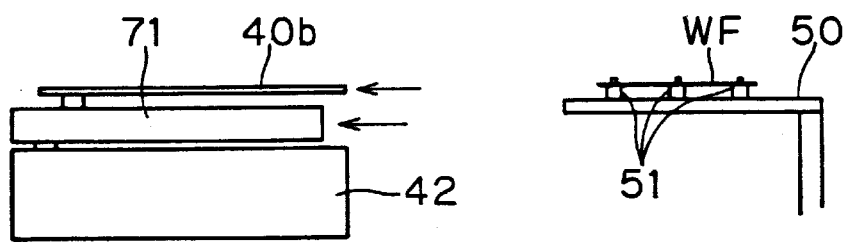
FIG. 14 is adapted to illustrate transfer of the substrate WF from the transport robot to the transfer robot.
Figure 15:
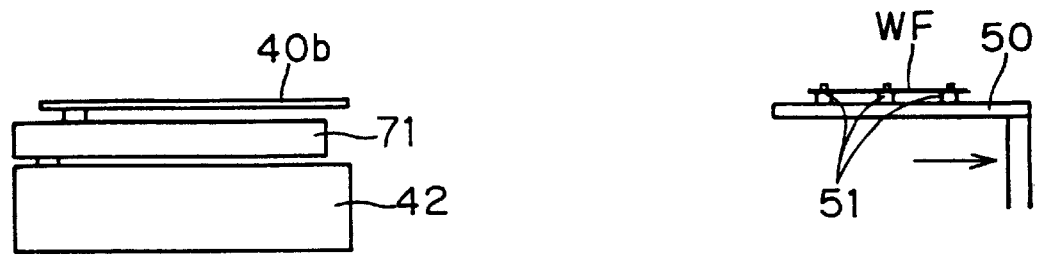
FIG. 15 is adapted to illustrate transfer of the substrate WF from the transport robot to the transfer robot.

The first hand 50 horizontally holds the substrate WF through three pins 51. This first hand 50 can reciprocate in the X and Z directions through a driving mechanism 80 with respect to a support 52 which can reciprocate in the Y direction. Consequently, the first hand 50 can reciprocate in the X, Y and Z directions. An air cylinder 81, which is also shown in FIG. 9, reciprocates the first hand 50 in the Z direction. A guide 82, a sliding member 83 and a belt mechanism (not shown) reciprocate the first hand 50 in the X direction. The second hand 60, which is supported by a support 61, can reciprocate in the X, Y and Z directions through a mechanism (not shown).

FIGS. 10 to 15 are adapted to illustrate transfer of the substrate WF from the transport robot TR1 to the transfer robot TR2. In the state shown in FIG. 10, the substrate WF completely subjected to the reverse processings in the unit arrangement part 10 is supported on the holder member 40b of the transport robot TR1, and the transfer robot TR2 raises the upper surface of the first hand 50 to a position slightly lower than the lower surface of the holder member 40b of the transport robot TR1 and horizontally moves to a position faced to the transport robot TR1. In the state shown in FIG. 11, the transfer robot TR2 advances the first hand 50 in the ±X direction and moves the same to the transfer position. In the state shown in FIG. 12, the transport robot TR1 moves the holder member 40b in the −X direction for moving the substrate WF to the transfer position. At this time, the upper surface of the first hand 50 is slightly lower than the lower surface of the holder member 40b while the lower surface of the substrate WF supported by the holder member 40b is higher than the top ends of the pins 51 projecting from the first hand 50, for preventing interference between the first hand 50 and the holder member 40b. In the state shown in FIG. 13, the transport robot TR1 slightly moves downward, for transferring the substrate WF supported on the holder member 40b to the first hand 50 (correctly, the pins 51). In the state shown in FIG. 14, the transport robot TR1 retreats and returns the holder member 40b to the original position. Finally, the first hand 50 of the transfer robot TR2 retreats and returns to the original position in the state shown in FIG. 15. The substrate WF held on the first hand 50 is transferred to the second hand 60 (not shown) due to relative vertical movement of the first and second hands 50 and 60, to be finally stored in any cassette CA of the indexer ID. While the transfer of the substrate WF from the transport robot TR1 to the transfer robot TR2 has been described, transfer from the transfer robot TR2 to the transport robot TR1 is performed through a procedure reverse to the above.

Figure 16:
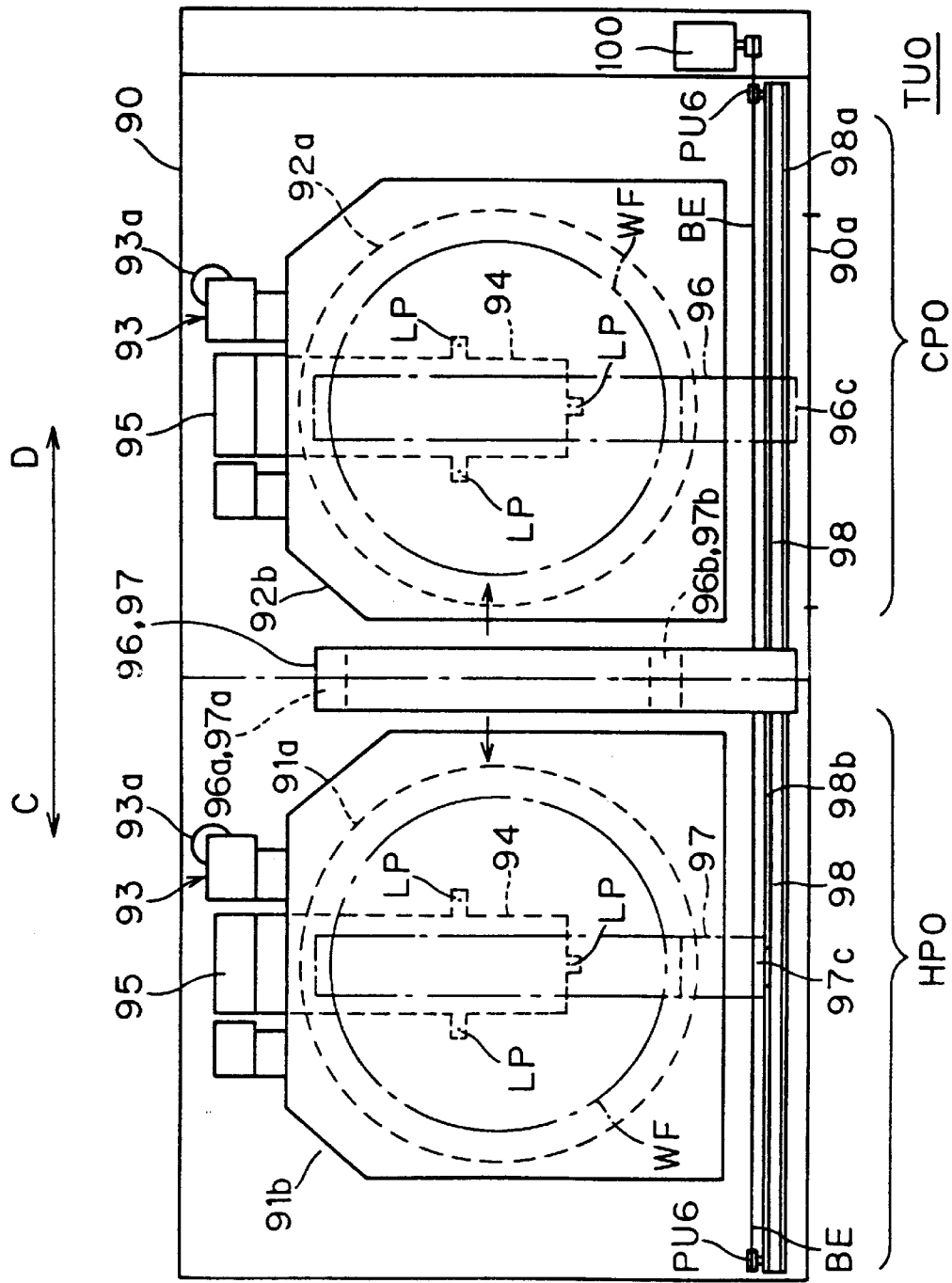
FIG. 16 is a plan view illustrating the structure of a thermal processing unit shown in FIG. 2.
Figure 17:
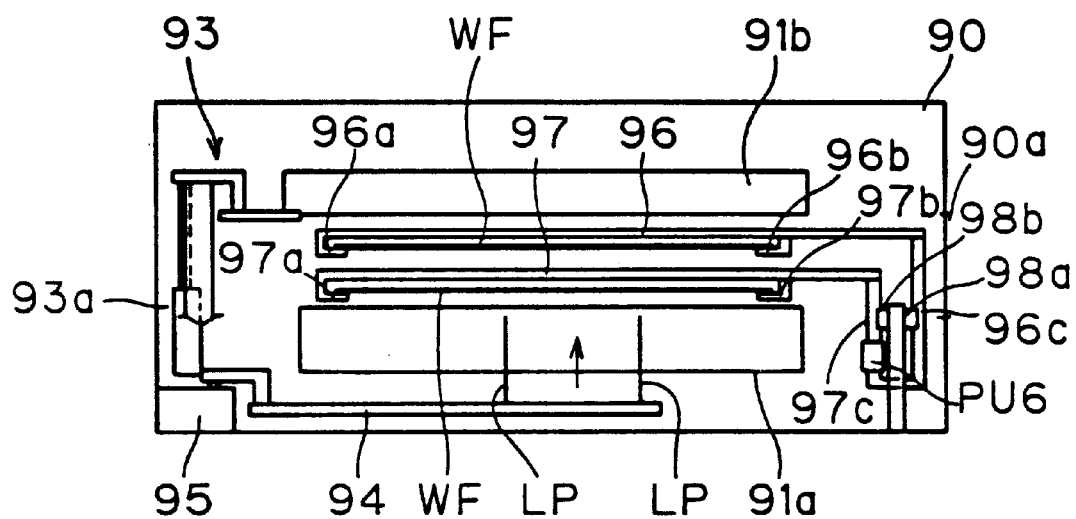
FIG. 17 is a side elevational view illustrating the structure of the thermal processing unit shown in FIG. 2.

FIG. 16 is a plan view illustrating the structure of the thermal processing unit TU0 shown in FIG. 2, and FIG. 17 is a side elevational view of the thermal processing unit TU0. The thermal processing unit TU0 illustrated in FIGS. 16 and 17 is stored in a case 90, the interior of which is divided into the hot plate part HP0 for performing heating and the cool plate part CP0 for performing cooling. An opening 90a of this thermal processing unit TU0 is formed only on the principal surface of the cool plate part CP0. This is because the substrate WF can be exchanged between the hot plate part HP0 and the cool plate part CP0 in the case 90 as described later in detail, and the substrate WF can be sufficiently introduced into/discharged from the thermal processing unit TU0 through the cool plate part CP0.

The hot plate part HP0 is provided with a plate 91a which is heating means containing a heater and a chamber 91b covering the same, while the cool plate part CP0 is provided with a plate 92a which is cooling means containing a cooling element such as a Peltier element and a chamber 92b covering the same. Vertical moving mechanisms 93 including air cylinders 93a guide/drive the chambers 91b and 92b for vertically moving the same respectively.

Lift pin driving arms 94 are arranged under the plates 91a and 92a respectively, and guided/driven by vertical moving mechanisms 95 containing motors etc. to be vertically moved. When the lift pin driving arms 94 are moved upward, lift pins LP project from the surfaces of the plates 91a and 92a, to be capable of upwardly moving substrates WF on the plates 91a and 92a. The vertical moving mechanisms 94 can vertically move the lift pin driving arms 94 stepwise, to be capable of upwardly moving the substrates WF on the plates 91a and 92a stepwise, too.

A vertical pair of transport arms 96 and 97 are arranged between the chambers 91b and 92b as carrier means for exchanging the substrates WF between the hot plate part HP0 and the cool plate part CP0. A pair of pawls 96a and 96b are projectingly provided on the lower surface of the upper first transport arm 96 for holding either substrate WF, so that the substrate WF can be transferred between the plates 91a and 92a by moving the transport arm 96 in the horizontal direction CD while upwardly moving and retreating the chambers 91b and 92b. Another pair of pawls 97a and 97b are projectingly provided on the lower surface of the lower second transport arm 97 for holding the remaining substrate WF, so that this substrate WF can be transferred between the plates 91a and 92a by moving the transport arm 97 in the horizontal direction CD while upwardly moving and retreating the chambers 91b and 91b.

A base part 96c of the upper first transport arm 96 is slidable along a guide 98a provided on a guide member 98, to allow linear movement of the first transport arm 96 along the horizontal direction CD. A base part 97c of the lower second transport arm 97 is also slidable along a guide 98b provided on the guide member 98, to allow linear movement of the second transport arm 97 in the horizontal direction CD.

A pair of pulleys PU6 are mounted on both ends of the guide member 98, and a belt BE is extended along these pulleys PU6. The base parts 96c and 97c of the first and second transport arms 96 and 97 are coupled to a pair of symmetrical positions of the belt BE respectively, to regularly move in opposite directions. The transport arms 96 and 97 move to retreated positions outside the chambers 91b and 92b when most separating from each other, and move to inner retreated positions shown by solid lines in FIG. 16 when most approaching to each other. The transport arms 96 and 97 can transfer/receive the substrates WF to/from the plates 91a and 92a by properly moving up/down the lift pins LP on substrate transfer positions shown by one-chain dot lines in FIG. 16.

Rotation of a motor 100 for driving the belt BE extended along the pulleys PU6 is properly controlled for moving the transport arms 96 and 97 in the horizontal direction CD.

Although not illustrated in the figures, a downflow of clean air is formed between the cool plate part CP0 and the hot plate part HP0, for thermally disconnecting the cool plate part CP0 and the hot plate part HP0 from each other. In consideration of more effective thermal disconnection between the cool plate part CP0 and the hot plate part HP0, the transport arms 96 and 97 are preferably arranged on the outer retreated positions. Further, the first and second transport arms 96 and 97 can be dedicated to transportation of cold and hot substrates WF respectively, not to rapidly cool or heat the substrates WF.

Figure 18:
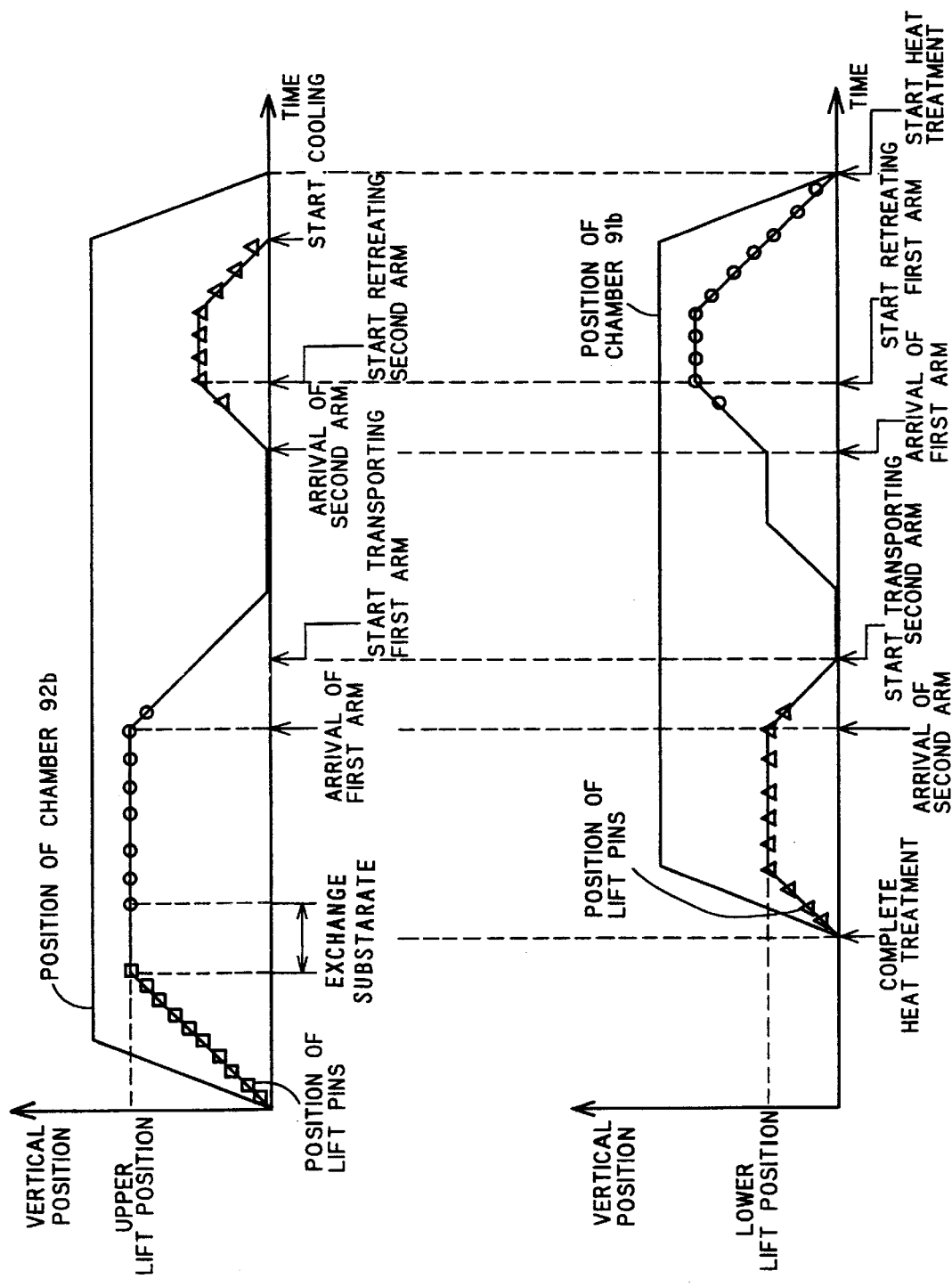
FIGS. 18 is adapted to illustrate exchange of a substrate in the thermal processing unit shown in FIGS. 16 and 17.

FIGS. 18 illustrates exchange of the substrates WF in the thermal processing unit TU0 shown in FIGS. 16 and 17. The upper part of FIG. 18 shows the positions of the lift pins LP and the chamber 92b in the cool plate part CP0, and the lower part of FIG. 18 shows the positions of the lift pins LP and the chamber 91b in the hot plate part HP0.

Immediately before the hot plate part HP0 completely heats the substrate WF, the cool plate part CP0 sufficiently moves up the chamber 92b to the retreated position, and moves up the top ends of the lift pins LP to an upper lift position. The transport robot TR1 shown in FIG. 4 etc. inserts its hand 40 from the front opening 90a of the cool plate part CP0, and exchanges an unprocessed substrate WF (○) provided on the hand 40 with a thermal-processed substrate WF (□) provided on the lift pins LP.

When completely heating the substrate WF, the hot plate part HP0 sufficiently moves up the chamber 91b to the retreated position, moves up the top ends of the lift pins LP to a lower lift position, and moves up the heated substrate WF (Δ) to the lower lift position. The thermal processing unit TU0 moves the first and second transport arms 96 and 97 from the inner retreated positions to the substrate transfer positions above the centers of the plates 92a and 91a respectively. At this time, the unprocessed substrate WF located on the upper lift position passes through a clearance between the body of the first transport arm 96 and the pawls 96a and 96b, while the heated substrate WF located on the lower lift position passes through a clearance between the body of the second transport arm 97 and the pawls 97a and 97b. Thus, interference between the transport arms 96 and 97 and the substrates WF is avoided.

When the transport arms 96 and 97 arrive at the substrate transfer positions above the centers of the plates 92a and 91a, the thermal processing unit TU0 starts downwardly moving the lift pins LP. When the lift pins LP downwardly move to some extent, the unprocessed substrate WF (○) and the heated substrate WF (Δ) are transferred to the first and second transport arms 96 and 97 respectively.

When the substrates WF are completely transferred from the lift pins LP to the transport arms 96 and 97, the positions of these transport arms 96 and 97 are exchanged. Namely, the unprocessed substrate WF (○) and the heated substrate WF (Δ) are moved toward the hot plate part HP0 and the cool plate part CP0 respectively.

When the first transport arm 96 arrives at the plate 91a and the second transport arm 97 moves onto the plate 92a for exchanging the positions thereof with each other, the lift pins LP of the plate 92a are moved up to the lower lift position and the lift pins LP of the plate 91a, which have been previously moved up to some extent, are moved up to the upper lift position. When these lift pins LP are moved up to some extent, the unprocessed substrate WF (○) is transferred to the lift pins LP of the plate 91a, and the heated substrate WF (Δ) is transferred to the lift pins LP of the plate 92a.

When completely transferring the substrates WF to the lift pins LP, the transport arms 96 and 97 move to the inner retreated positions.

When the transport arms 96 and 97 completely retreat, the substrates WF are moved down with the lift pins LP so that the heated substrate WF (Δ) is placed on the plate 92a with interposition of a small clearance and the unprocessed substrate WF (○) is placed on the plate 91a with interposition of a small clearance. At the same time, the chambers 91b and 92b are also moved down to define semi-closed spaces around the upper surfaces of the plates 91a and 92a.

The heated substrate WF (Δ) placed on the plate 92a is cooled here, and the unprocessed substrate WF (○) placed on the plate 91a is heated here in a prescribed process.

While the present invention has been described with reference to the concrete embodiment, the present invention is not restricted to the aforementioned embodiment. The coating units SC1 and SC2 and the developing units SD1 and SD2 serving as wet processing units for processing each substrate WF with chemical liquids may be in arrangement of any combination so far as the same are provided under the multistage thermal processing units 20. Further, any of the wet processing units, e.g., the coating unit SC1, may be freely replaced with a multistage thermal processing unit similar to the multistage thermal processing units 20.

The multistage thermal processing units 20 may not be arranged above all wet processing units, but the same may be arranged above at least one wet processing unit.

While the cleaning unit SS serving as the substrate processing unit is arranged between the coating units SC1 and SC2, this cleaning unit SS may be omitted. Further, the cleaning unit SS may be arranged between wet processing units other than the coating processing units SC1 and SC2.

Figure 19:
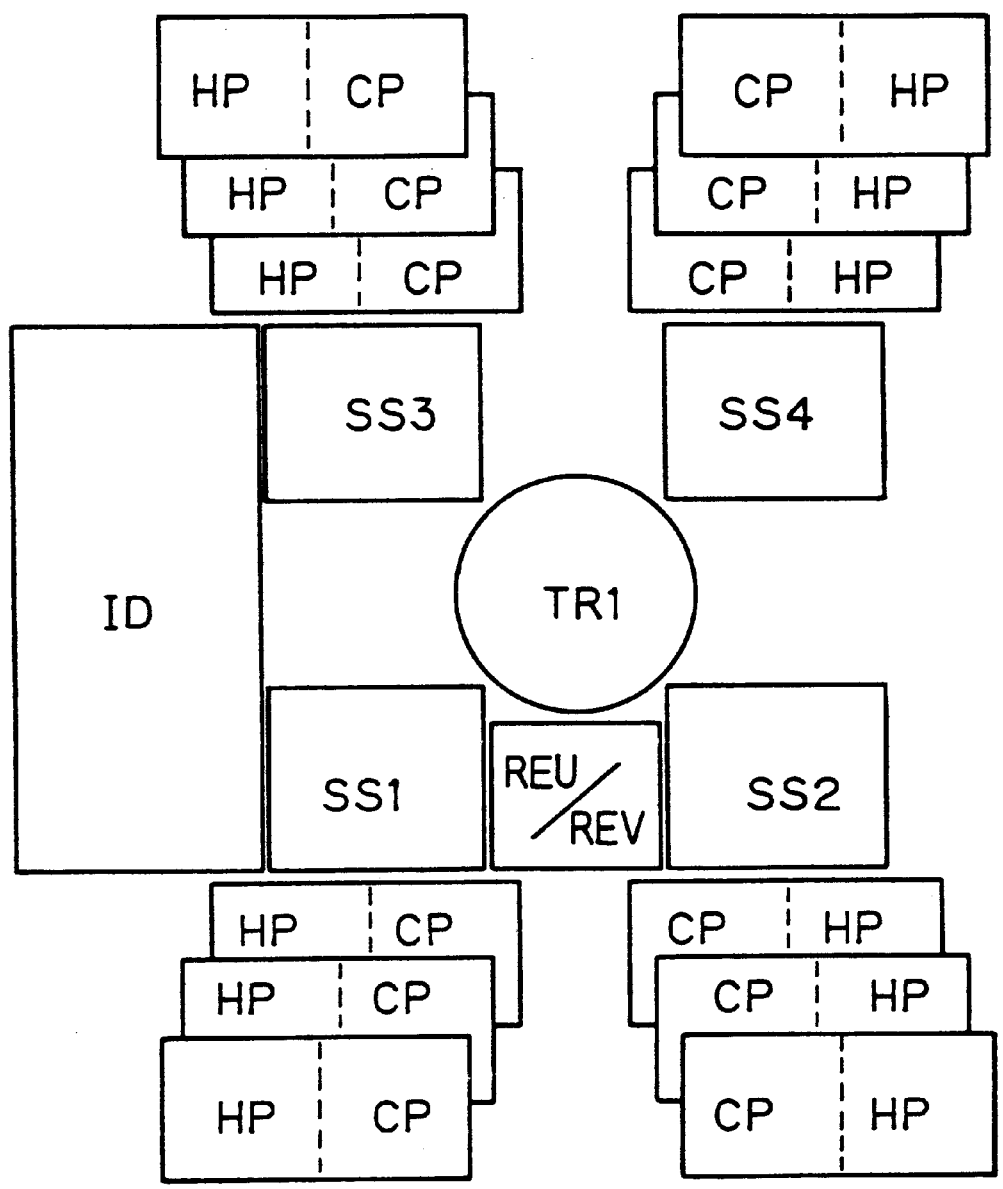
FIG. 19 is adapted to illustrate a modification of the substrate processing apparatus shown in FIG. 2.

As shown in FIG. 19, all wet processing units may be formed by cleaning units SS1 to SS4. In this case, a substrate reversal unit for reversing each substrate can be arranged between the cleaning units SS1 and SS2.

Figure 20A:
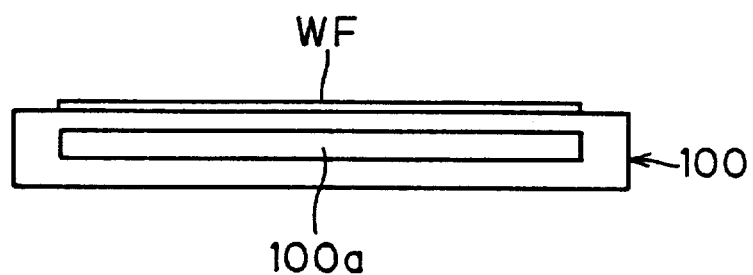
FIGS. 20A and 20B adapted to illustrate modifications of the thermal processing unit shown in FIGS. 16 and 17.
Figure 20B:
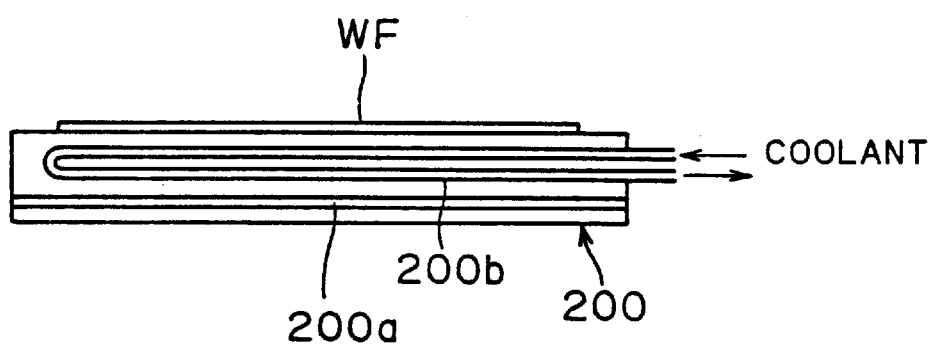

Each substrate WF can be heated/cooled with a single plate, in place of the thermal processing unit TU0 shown in FIGS. 16 and 17. While there is no need to provide carrier means such as the transport arms 96 and 97 for exchanging the substrate WF in this case, the single plate must have functions of heating and cooling. FIGS. 20A and 20B illustrate temperature control units for such plates. FIG. 20A shows a plate 100 provided with a Peltier element 100a capable of heating and cooling the substrate WF in its interior. The Peltier element 100a heats the plate 100 as well as the substrate WF when a heating current is applied thereto, while the same cools the plate 100 as well as the substrate WF when a cooling current is applied thereto. FIG. 20B shows a plate 200 provided with a heater 200a for heating and a pipe 200b supplied with a coolant. The pipe 200b is supplied with previously cooled oil having a relatively high melting point or the like. The pipe 200b is arranged immediately under the substrate WF in substantially equal density, for uniformly cooling the plate 200.

The thermal processing units may be arranged so that processing units provided with a single plate for performing heating and processing units provided with a single plate for performing cooling are stacked above the wet processing units.

The thermal processing units are arranged above the wet processing units in the aforementioned embodiment in the structure arranging a plurality of wet processing units around the transport means, whereby the atmosphere of the region enclosed with the wet processing units is not thermally influenced by the thermal processing units but the wet processing units can stably process the substrate.

The respective driving mechanisms for the transport robot TR1 and the like are not restricted to those described above. For example, the expansion/contraction driving mechanism 70 may use a mechanism employing a screw shaft and a nut member in place of the belt feed mechanism employing the pulleys and the belt, or another well-known means can be applied thereto. Further, the Z-axis driving mechanism 45 is not restricted to the pantograph structure but an effect similar to the above can be attained by employing another expansion/contraction/vertical moving mechanism such as a stretch interlocking mechanism employing pulleys and a wire, for example.

While the invention has been shown and described in detail, the following description is in all aspects illustrative and restrictive. It is therefore understood that numerous modifications and variations can be devised without departing from the scope of the invention.

We claim:

1. An apparatus for processing a substrate, comprising:
   a) substrate transport means being vertically movable and rotatable about a vertical axis;
   b) a plurality of wet processing units being arranged around said substrate transport means for processing said substrate with prescribed processing liquids, said plurality of wet processing units being in a first section; and
   c) at least one thermal processing unit being arranged in a second section for applying a thermal process to said substrate, said second section being stacked on said first section.

2. The apparatus in accordance with claim 1, wherein at least one of said wet processing units is a coating unit for forming a coating film on said substrate.

3. The apparatus in accordance with claim 1, wherein at least one of said wet processing units is a developing unit for developing said substrate with a developer.

4. The apparatus in accordance with claim 1, wherein at least one of said wet processing units is a cleaning unit for supplying a cleaning liquid to said substrate.

5. The apparatus in accordance with claim 1, wherein said at least one thermal processing unit comprises a complex unit including:
   heating means for heating said substrate,
   cooling means for cooling said substrate, and
   a processing chamber storing said heating means and said cooling means.

6. The apparatus in accordance with claim 5, wherein said heating means comprises a heating plate for heating said substrate, said cooling means comprises a cooling plate for cooling said substrate, said complex unit further comprises:

transport means provided in said processing chamber and operable to transport said substrate between said heating plate and said cooling plate, and said substrate is placed on said cooling plate before and after heating process on said heating plate.

7. The apparatus in accordance with claim 5, wherein said heating means and said cooling means are united into a thermal means comprising:

a plate for receiving said substrate thereon, and temperature control means for controlling the temperature of said plate.

8. An apparatus for processing a substrate, comprising:

a) substrate transport means being vertically telescopic and rotatable about a vertical axis; and b) a plurality of processing unit groups being arranged around said substrate transport means, said plurality of processing unit groups comprising;

a multistage unit group being formed by stacking a plurality of processing units in multiple stages, wherein said substrate transport means can access all of said plurality of processing unit groups.

9. The apparatus in accordance with claim 8, wherein at least one of said plurality of processing units is a coating unit for forming a coating film on said substrate.

10. The apparatus in accordance with claim 8, wherein at least one of said plurality of processing units is a developing unit for developing said substrate with a developer.

11. The apparatus in accordance with claim 8, wherein at least one of said plurality of processing units is a cleaning unit for supplying a cleaning liquid to said substrate.

12. The apparatus in accordance with claim 8, wherein said substrate transport means comprises a pantograph structure which is telescopic in a vertical direction.

13. An apparatus for processing a substrate, comprising:

a) substrate transport means comprising:

a-1) a rotation mechanism for rotating a transport arm holding said substrate about a vertical axis, and a-2) a telescopic mechanism for horizontally expanding and contracting said transport arm linearly over a plurality of stages; and b) a plurality of processing units being arranged around said substrate transport means.

14. The apparatus in accordance with claim 16, wherein said substrate transport means comprises a vertical moving mechanism movable in a vertical direction, and said plurality of processing units comprise:

b-1) a wet processing unit for supplying a prescribed processing liquid to said substrate and processing said substrate with said processing liquid, and b-2) a thermal processing unit being arranged above said wet processing unit for applying a thermal process to said substrate.

15. An apparatus for processing a substrate, comprising:

a) a plurality of comer units being arranged on four comer positions of a unit arrangement part having a substantially rectangular bottom surface region for performing processings with prescribed processing liquids respectively; and b) substrate transport means being arranged at a central portion of said unit arrangement part and rotatable about a vertical axis.

16. The apparatus in accordance with claim 18, wherein said plurality of corner units include a coating unit for forming a coating film on said substrate and/or a developing unit for developing said substrate with a developer.

17. The apparatus in accordance with claim 15, further comprising a thermal processing unit being arranged above said plurality of corner units for applying a thermal process to said substrate.

18. The apparatus in accordance with claim 17, wherein said thermal processing unit comprises:

heating means for heating said substrate, cooling means for cooling said substrate, and a processing chamber storing said heating means and said cooling means.

19. A substrate transfer apparatus for transferring/receiving a substrate to/from a processing section having a plurality of processing units being arranged around substrate transport means, comprising:

a) a body part moving between said processing section and a cassette storing said substrate in the exterior of said processing section;

b) a first hand being loaded on said body part for accessing said cassette; and c) a second hand being loaded on said body part for accessing said substrate transport means, said substrate being transferable between said first and second hands.

20. An apparatus for processing a substrate, comprising:

a) substrate transport means being vertically telescopic and rotatable about a vertical axis; and b) a plurality of processing unit groups being arranged around said substrate transport means, said plurality of processing unit groups comprising:

a multistage unit group being formed by stacking a plurality of processing units in multiple stages, said multistage unit group comprising:

a wet processing unit being provided on the lowermost stage of said multistage unit group, and a thermal processing unit arranged on said wet processing unit, wherein said substrate transport means can access all of said plurality of processing unit groups.

21. The apparatus in accordance with claim 20, wherein said thermal processing unit comprises:

heating means for heating said substrate;

cooling means for cooling said substrate; and a processing chamber storing said heating means and said cooling means.

22. An apparatus for processing a substrate, comprising:

a) substrate transport means being vertically movable and rotatable about a vertical axis;

b) four wet processing units being arranged around said substrate transport means for processing said substrate with prescribed processing liquids, said four wet processing units being in a first section; and c) at least one thermal processing unit being arranged in a second section for applying a thermal process to said substrate, said second section being stacked on said first section.

23. An apparatus for processing a substrate, comprising:
a) substrate transport means being vertically telescopic and rotatable about a vertical axis; and
b) a plurality of processing unit groups being arranged around said substrate transport means, said plurality of processing unit groups comprising:
a multistage unit group being formed by stacking a plurality of processing units in multiple stages, wherein
said substrate transport means can access all of said plurality of processing unit groups, and
said substrate transport means comprises:
a-1) a base provided below said plurality of processing unit groups; and
a-2) a telescopic mechanism provided on said base.

24. An apparatus for processing a substrate, comprising:
a) substrate transport means being vertically telescopic and rotatable about a vertical axis; and
b) a plurality of processing unit groups being arranged around said substrate transport means, said plurality of processing unit groups comprising:
a multistage unit group being formed by stacking a plurality of processing units in multiple stages, said multistage unit group comprising:
a wet processing unit being provided on the lowermost stage of said multistage unit group, and
a thermal processing unit arranged on said wet processing unit, wherein
said substrate transport means can access all of said plurality of processing unit groups, and
said substrate transport means comprises:
a-1) a base provided below said plurality of processing unit groups; and
a-2) a telescopic mechanism provided on said base.

* * * * *